United States Patent [19]

Okinaka

[11] 4,349,411
[45] Sep. 14, 1982

[54] ETCH PROCEDURE FOR ALUMINUM ALLOY
[75] Inventor: Yutaka Okinaka, Madison, N.J.
[73] Assignee: Bell Telephone Laboratories, Incorporated, Murray Hill, N.J.
[21] Appl. No.: 308,270
[22] Filed: Oct. 5, 1981
[51] Int. Cl.³ .............................. C23F 1/00; C23F 1/02
[52] U.S. Cl. ................................ 156/659.1; 156/656; 156/665; 252/79.5
[58] Field of Search ............ 252/79.5; 156/656, 659.1, 156/665

[56] References Cited
U.S. PATENT DOCUMENTS
2,739,883  3/1956  Newman .............................. 252/79.5
3,356,550 12/1967  Stiffler et al. ................... 252/79.5 X
3,725,309  4/1973  Ames et al. .......................... 252/512

Primary Examiner—William A. Powell
Attorney, Agent, or Firm—Walter G. Nilsen

[57] ABSTRACT

A process is described for making devices with aluminum-copper alloy in which the aluminum-copper alloy is etched in a basic solution. This procedure is particularly applicable to memory devices and bubble memory devices containing magnetic material (i.e., permalloy) where acid etches cannot be used. Excellent results are obtained with the basic etching solution. In particular the aluminum-copper alloy is completely removed and etching rates are sufficiently fast for commercial manufacturing operations.

17 Claims, 2 Drawing Figures

ETCH PROCEDURE FOR ALUMINUM ALLOY

TECHNICAL FIELD

The invention is a process involving etching of aluminum-copper alloy.

BACKGROUND OF THE INVENTION

Metallic thin films are used extensively in a variety of electronic devices and applications. They are used to make electrical conducting paths to interconnect various parts of an electrical device. Such conducting paths might also be used to create stationary or moving magnetic fields and/or electrostatic fields. Such metallic thin films might also be used as an electrical contact surface or as a bonding surface (bonding pad) in various types of devices. Metallic thin films are used in various memory devices such as magnetic bubble devices as well as in a variety of integrated circuits. A variety of metals and alloys are used for metallic thin films including aluminum, gold, titanium-gold, molybdenum-gold, titanium-platinum-gold, etc. By far, the most extensively used material is aluminum.

The recent trend toward increasing component density and additional miniaturization in integrated circuits and memory devices has greatly increased current densities in conducting paths. At such high current densities, electromigration becomes a serious reliability problem. Ames et al. (U.S. Pat. No. 3,725,309) suggested a procedure for greatly reducing the electromigration of aluminum. They observed that the introduction of small amounts (typically 0.1 to 10 weight percent, usually 4 to 6 weight percent) of copper into the aluminum greatly decreased the electromigration of aluminum and increased the lifetimes of conductive stripes in integrated circuits and other electrical devices.

In electronic circuits and memory circuits, thin films are usually patterned by covering the area with a metal layer and removing unwanted metal often by chemical etching. For aluminum-copper metal layers, acid etches are most often used. Typical acid etches are phosphoric acid generally mixed with nitric acid and acetic acid.

Such etches yield excellent results for the majority of applications. However, in some applications, an acid etch cannot be used. Usually, this situation arises where some necessary part of the circuit is attacked by acid etches. A particular case in point is in the fabrication of magnetic memory circuits such as bubble memories. In these devices, it is often necessary to incorporate a layer of magnetic material (i.e., permalloy) in the device. Acid etches cannot be used because such etches often attack magnetic material.

In the case of pure aluminum, various alkaline etches such as aqueous NaOH or aqueous KOH give excellent results. In the case of aluminum-copper alloys, some residue remains which is usually removed by agitation or abrasion. It is highly desirable to have an etching process where the entire alloy is dissolved in the etching solution. Such a process would avoid exposing the various devices to abrasive manufacturing operations and remove the possibility that the residue would interfere with operation of the device.

SUMMARY OF THE INVENTION

The invention is a process for producing a device in which an aluminum-copper alloy is etched using an alkaline aqueous etch solution comprising oxidizing agent for metallic copper, complexing agent for copper ions, surfactant and alkaline agent sufficient to make the pH at least 10. Most often, the aluminum-copper is in the form of a film with thickness less than 100 $\mu$m; typically in integrated circuits or memory devices from 0.5 to 10 $\mu$m. Generally, an aqueous solution of alkali-metal hydroxide (i.e., NaOH, KOH, etc.) is used as the alkaline agent. A higher pH (e.g., 11 or even 12) is usually preferred because it produces more rapid etching of the aluminum-copper alloy. This procedure eliminates the need for abrasive removal of residue and makes the fabrication of devices comprising aluminum-copper alloys that are etched more rapid, efficient and reliable.

DETAILED DESCRIPTION

Figure 1:
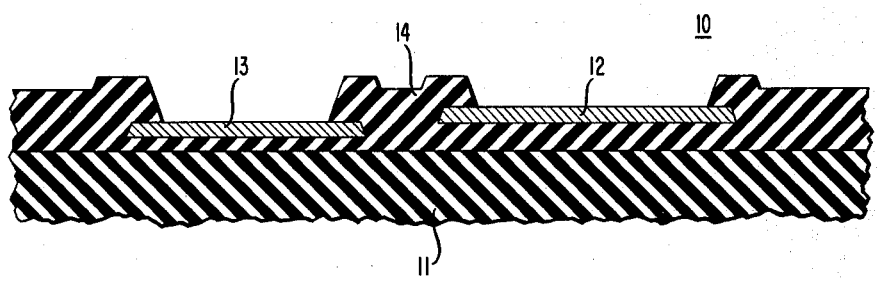
FIG. 1 shows a cross-section of a typical magnetic bubble device before application of Al-Cu pads.

The invention is based on the observation that aluminum-copper alloy can be etched in basic solution without leaving a residue by inclusion in the etch solution of an oxidizing agent for copper. Oxidizing agents for copper (in basic solution) are well known and selection of the particular oxidizing agent to be used usually depends on etching rates desired, compatibility with other materials on the device which is exposed to the etching solution, etc. To prevent precipitation of copper ions, a suitable complexing agent is included in the etching solution.

A large variety of oxidizing agents are useful in the practice of the invention. Oxidizing agents for the oxidation of copper are well known. Selection usually depends on convenience and avoidance of contamination. Typical oxidizing agents are hydrogen peroxide (aqueous peroxide solution), perborate ion (i.e., sodium or potassium perborate), persulfate ion (i.e., sodium, potassium or ammonium persulfate), monopersulfate ion i.e., sodium or potassium monopersulfate), ferricyanide ion (i.e., sodium or potassium ferricyanide), ozone, oxygen gas and air. Monopersulfate ion is often supplied in the form $2KHSO_5 \cdot KHSO_4 \cdot K_2SO_4$. Solution concentrations from 0.001 molar to saturation yield satisfactory results, but generally a fairly low concentration (0.001 to 0.1 molar) is preferred. Higher concentrations also may be used (where the oxidizing agent is stable) but is wasteful of material. Lower concentrations than 0.001 molar while still effective would require frequent replenishing of the solution.

To prevent precipitation of copper ions in the basic etching solution, a complexing agent for copper is included in the etching solution. Complexing agents for copper ions are well known and selection of a particular complexing agent often depends on economic considerations, availability, compatibility with other substances in the etching solution or materials on the device being etched, etch rates, etc. The general classes of compounds which are useful as complexing agents for copper ions are aliphatic amines, aromatic amines, amino acids, heterocyclic nitrogen compounds such as pyridine and its derivatives and ethylenediaminetetraacetic acid (or salt) and related compounds. Particularly effective complexing agents are ammonia, ethylenediaminetetraacetic acid and salts, monoethanolamine, diethanolamine, triethanolamine, diaminopropane, pyridine, ethyleneglycolbis(aminoethylether) tetraacetic acid and salts, nitrilotriacetic acid and salts and amino acids such as glycine, alanine, etc., and associated salts.

Optionally, a surfactant may also be included in the etching solution. The surfactant should be stable with regard to other substances in the etching solution, especially the strongly alkaline nature of the etching solution. Various types of surfactants may be used including non-ionic types, anionic types and cationic types. The surfactant acts as a wetting agent and aids in the removal of hydrogen gas bubbles which tend to cling to etch patterns and impede access of the etch solution to the surface being etched. Typical anionic surfactants are organic phosphate esters, alkali-metal salts of alkylarylpolyether sulfonate, alkali-metal salts of lauryl sulfate, etc. A typical cationic surfactant is stearyl dimethyl benzyl ammonium chloride and typical non-ionic surfactants are polyalkoxylated alkylphenols with the alkyl group having from 1-20 carbon atoms (i.e., octyl phenoxy (10) polyethoxy ethanol).

The procedure for etching is generally conventional. Room temperature is preferred because of convenience but higher temperatures may be used where necessary as, for example, to achieve higher etching rates. Agitation may be used although it is not necessary. Generally, the surface to be etched is contacted with the etching solution and left in the solution until the aluminum-copper alloy is removed. Masks are used where the etching procedure is to be confined to designated areas. Because of the strongly alkaline nature of the etching solution (pH often near 13), special precautions are often necessary to prevent chemical attack on the mask (generally a positive photoresist masking layer). One procedure is to thermally cross-link the resist material by heating (typically to 150 to 250 degrees C.) for 10 minutes to 2 hours. This procedure generally prevents chemical attack of the resist material by the highly alkaline etching solution. The etching procedure described above may be used on a wide variety of devices which contain alloys of aluminum and copper. Although the procedure yields perfectly satisfactory results for a wide range of copper concentrations, including alloys with up to 50 weight percent copper, remainder aluminum, most commercial applications involve copper concentrations up to approximately 10 weight percent.

Figure 2:
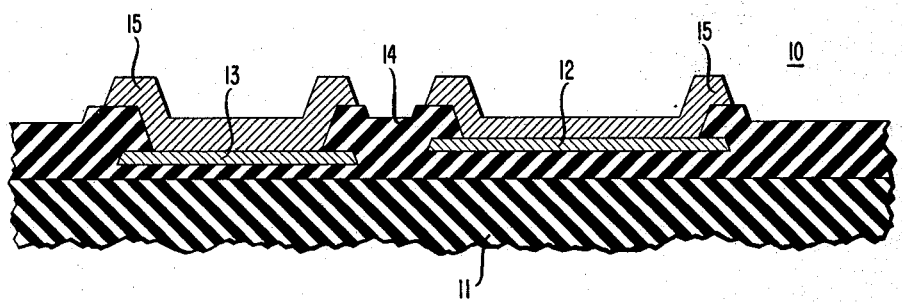
FIG. 2 shows a cross-section of the same device as in FIG. 1 after application of the Al-Cu pads.

The procedure is particularly valuable in fabricating certain magnetic devices where acid etches attack magnetic materials. Typical such devices are bubble memories which contain various magnetic materials, including permalloy. A side view of a typical bubble device 10 is shown in FIG. 1. Here the device is mounted on a garnet material 11 with permalloy 12 and aluminum 13 embedded in a silicon dioxide layer 14. The problem is to build up conducting pads on top of the aluminum and permalloy so as to make electrical contact with these materials. Delineation of the pads must be accomplished in the presence of the permalloy. The presence of the magnetic material permalloy precludes use of an acid etch. The aluminum-copper alloy is put down on the top surface, generally by a sputtering procedure or evaporation procedure and the delineation by etching in accordance with the invention. The finished product is shown in FIG. 2 in which the aluminum-copper alloy 15 is shown on top of the aluminum contact and permalloy layer.

The preferred composition of the etching solution is given in the table below.

TABLE I

| Reagent | Preferred Concentration Range | Most Preferred Concentration Range |
|---|---|---|
| KOH | 0.01–1 molar | 0.05–0.2 molar |
| monoethanolamine | 0.01–1 molar | 0.05–0.2 molar |
| peroxide solution | 0.003–0.15 molar | 0.01–0.1 molar |
| surfactant (phosphate ester) | 0.0001–0.01 molar | 0.0005–0.05 molar |

The preferred ranges of concentrations are to optimize the process, namely to maximize etching rate but minimize undercutting. Too high a concentration of alkali leads to excessive attack on the aluminum metal before undercutting. Also, excessive alkali leads to too rapid decomposition of the aqueous hydrogen peroxide. Too low a concentration of alkali results in an excessively slow etch rate.

Too high a concentration of complexing agent leads to a high viscosity solution where removal of gas bubbles from the Al-Cu surface is difficult. Also excessive concentrations of the complexing agent (monoethanolamine above) does not markedly improve the process. Too little complexing agent slows the removal of copper leading to excessive residue and occasionally to undercutting by the alkaline solution.

Too high a concentration of aqueous hydrogen peroxide will sometimes passivate the aluminum surface. Too low a concentration will retard removal of the copper residue.

Use of a surfactant promotes smoother, more uniform etching. It is believed that this is due to removal of the gas bubbles adhering to the surface, especially the metal-resist interface. Too low a concentration of surfactant permits gas bubbles to adhere to the surface; too high a concentration leads to excessive foaming of the etch solution.

What is claimed is:

1. A process for making a device comprising aluminum-copper alloy comprising the step of etching the aluminum-copper alloy with an etching solution characterized in that the etching solution has pH greater than 10 and comprises oxidizing agent for metallic copper, complexing agent for copper ions and surfactant.

2. The process of claim 1 in which the aluminum-copper alloy consists essentially of 0.1 to 10 weight percent copper, remainder aluminum.

3. The process of claim 2 in which the aluminum-copper alloy consists essentially of 4 to 6 weight percent copper, remainder aluminum.

4. The process of claim 1 in which the pH is greater than 11.

5. The process of claim 4 in which the pH is greater than 12.

6. The process of claim 5 in which the pH is greater than 13.

7. The process of claim 1 in which the oxidizing agent is selected from the group consisting of hydrogen peroxide, perborate ion, persulfate ion, monopersulfate ion, ferricyanide ion, ozone, oxygen gas and air.

8. The process of claim 7 in which the oxidizing agent is hydrogen peroxide.

9. The process of claim 1 in which the complexing agent is selected from the group consisting of aliphatic amines, aromatic amines, amino acids, heterocyclic nitrogen compounds and diamine compounds.

10. The process of claim 9 in which the complexing agent is selected from the group consisting of ammonia, ethylenediaminetetraacetic acid and salts of this acid, monoethanolamine, diethanolamine, triethanolamine, diaminopropane, pyridine, ethyleneglycolbis(aminoethylether) tetraacetic acid and salts of this acid, nitrilotriacetic acid, alanine and glycine.

11. The process of claim 10 in which the complexing agent is monoethanolamine.

12. The process of claim 1 in which the etching solution comprises a surfactant.

13. The process of claim 1 in which the aluminum-copper alloy is in the form of a film with thickness less than 100 μm.

14. The process of claim 13 in which the film has thickness between 0.5 and 10 μm.

15. The process of claim 1 in which the device is a bubble memory device.

16. The process of claim 15 in which the aluminum-copper alloy is sputtered on a surface prior to etching to form a aluminum-copper alloy layer and a resist material is put down to cover at least partially the aluminum-copper alloy layer prior to etching the aluminum-copper alloy layer.

17. The process of claim 16 in which the resist material is heated to between 150 and 250 degrees C. for 10 minutes to 2 hours prior to etching the aluminum-copper alloy.

* * * * *